(12) United States Patent
Ori (10) Patent No.: US 10,919,810 B2
(45) Date of Patent: Feb. 16, 2021

(54) CEMENTED CARBIDE AND COATED CEMENTED CARBIDE

(71) Applicant: TUNGALOY CORPORATION, Fukushima (JP)

(72) Inventor: Shinya Ori, Iwaki (JP)

(73) Assignee: TUNGALOY CORPORATION, Iwaki (JP)

( * ) Notice: Subject to any disclaimer, the term of this patent is extended or adjusted under 35 U.S.C. 154(b) by 145 days.

(21) Appl. No.: 16/210,950

(22) Filed: Dec. 5, 2018

(65) Prior Publication Data

US 2019/0194077 A1 Jun. 27, 2019

(30) Foreign Application Priority Data

Dec. 27, 2017 (JP) .................................. 2017-252168

(51) Int. Cl.
*B23B 27/14* (2006.01)
*C04B 35/56* (2006.01)
(Continued)

(52) U.S. Cl.
CPC ............ *C04B 35/5626* (2013.01); *B22F 3/24* (2013.01); *B23B 27/148* (2013.01); *C04B 35/6303* (2013.01); *C04B 41/4531* (2013.01); *C04B 41/5031* (2013.01); *C22C 29/08* (2013.01); *C23C 16/0272* (2013.01); *C23C 16/34* (2013.01); *C23C 16/36* (2013.01); *C23C 16/403* (2013.01); *C23C 28/042* (2013.01); *C23C 28/044* (2013.01); *B22F 1/0059* (2013.01); *B22F 1/0074* (2013.01); *B22F 3/1134* (2013.01); *B22F 9/026* (2013.01); *B22F 2005/001* (2013.01); *B22F 2207/17* (2013.01); *B22F 2998/10* (2013.01); *B22F 2999/00* (2013.01); *B23B 2224/04* (2013.01); *B23B 2224/12* (2013.01); *B23B 2224/28* (2013.01);
(Continued)

(58) Field of Classification Search
CPC .............................. B23B 27/14; C04B 35/562
USPC .................... 428/325, 336, 457, 469, 698
See application file for complete search history.

(56) References Cited

U.S. PATENT DOCUMENTS 4,956,012 A * 9/1990 Jacobs .................... C22C 29/08
 419/18
5,580,666 A * 12/1996 Dubensky ............... C22C 29/08
 428/546
(Continued)

FOREIGN PATENT DOCUMENTS

| CN | 103882275 | * | 6/2014 |
| JP | 08-209284 | * | 8/1996 |

(Continued)

*Primary Examiner* — Archene A Turner
(74) *Attorney, Agent, or Firm* — Studebaker & Brackett PC (57) ABSTRACT

A cemented carbide comprising a predetermined hard phase, a predetermined binder phase and a predetermined composite compound phase, wherein: a content ratio of each of the hard phase, the binder phase and the composite compound phase based on total contents of the hard phase, the binder phase and the composite compound phase in the cemented carbide falls within a predetermined range; and the composite compound phase comprises an aggregate containing a small-diameter aggregate which satisfies a predetermined condition and a large-diameter aggregate which satisfies a predetermined condition.

20 Claims, 2 Drawing Sheets

(51) Int. Cl.
*C04B 41/45* (2006.01)
*C04B 41/50* (2006.01)
*C04B 35/63* (2006.01)
*C23C 16/36* (2006.01)
*C23C 28/04* (2006.01)
*C22C 29/08* (2006.01)
*B22F 3/24* (2006.01)
*C23C 16/34* (2006.01)
*C23C 16/40* (2006.01)
*C23C 16/02* (2006.01)
*C04B 41/52* (2006.01)
*B22F 3/11* (2006.01)
*B22F 9/02* (2006.01)
*B22F 5/00* (2006.01)
*B22F 1/00* (2006.01)

(52) U.S. Cl.
CPC ....... *B23B 2224/36* (2013.01); *B23B 2228/04* (2013.01); *C04B 41/52* (2013.01); *C04B 2235/3839* (2013.01); *C04B 2235/3843* (2013.01); *C04B 2235/3856* (2013.01); *C04B 2235/3886* (2013.01); *C04B 2235/5436* (2013.01); *C04B 2235/783* (2013.01); *C04B 2235/786* (2013.01); *C04B 2235/85* (2013.01); *C04B 2235/96* (2013.01)

(56) References Cited

U.S. PATENT DOCUMENTS

| | | | | |
|---|---|---|---|---|
| 5,624,766 | A | * | 4/1997 | Moriguchi ............ C23C 30/005 428/548 |
| 6,294,129 | B1 | * | 9/2001 | Waldenstrom .......... C22C 1/051 419/18 |
| 2005/0126336 | A1 | * | 6/2005 | Jansson ................... C22C 29/08 75/240 |
| 2011/0315051 | A1 | * | 12/2011 | Olsen ...................... C22C 29/06 106/286.3 |

FOREIGN PATENT DOCUMENTS

| | | | |
|---|---|---|---|
| JP | 2008-132570 | * | 6/2008 |
| JP | 2017-024165 A | | 2/2017 |
| JP | 2017-109189 A | | 6/2017 |

\* cited by examiner

Normal Structure

Aggregate of Composite Compound Phase

CEMENTED CARBIDE AND COATED CEMENTED CARBIDE

TECHNICAL FIELD

The present invention relates to a cemented carbide and a coated cemented carbide.

BACKGROUND ART

There have been an increasing number of opportunities in which cutting is performed on difficult-to-machine materials, such as titanium alloys used for aircraft parts, etc., as well as nickel-based heat-resistant alloys and cobalt-based heat-resistant alloys used for turbine blades for electric generators. In the cutting of difficult-to-machine materials with low thermal conductivity, such as nickel-based heat-resistant alloys and cobalt-based heat-resistant alloys, the cutting temperature is prone to become high. In such high-temperature machining, the strength of the cutting edge of a cutting tool is reduced, thereby leading to the occurrence of fracturing, so that the tool life will be extremely short compared to that involved in the past machining of general steel. In view of this, in order to achieve the long life of a cutting tool even when cutting difficult-to-machine materials, there has been a need to enhance the high-temperature strength of the cutting tool.

For example, with the aim of providing a cutting tool made of a WC-based cemented carbide which has high transverse rupture strength, excellent chipping resistance and high hot hardness, and accordingly has excellent tool life in the highly efficient machining of difficult-to-machine materials, JP2017-024165 A discloses a cutting tool made of a WC-based cemented carbide wherein: a WC average particle size is from 0.3 μm or more to 2.0 μm or less; the WC-based cemented carbide contains, as components for forming a binder phase: 9.0 mass % or more to 14.0 mass % or less of Co; 1.0 mass % or more to 8.0 mass % or less of Ta with respect to Co; and 3.0 mass % or more to 10.0 mass % or less of Cr with respect to Co; and WC particles are bound to one another via Co. This cutting tool comprises a complex carbide phase containing Ta, W, Co and Cr $(Ta_xW_yCr_zCo_\alpha)C$ in the WC-based cemented carbide, the composition (atom %) of the metal components of the complex carbide phase involves the following expressions: $x+y+z+\alpha=100$; $80 \le x \le 85$; $10 \le y \le 15$; $z \le 5$; and $1 \le \alpha \le 5$, the longest diameter of an aggregate comprising a complex carbide phase with an average particle size of from 500 nm or less is 1 μm or less, and the aggregate is located adjacent to a binder phase.

SUMMARY

Technical Problem

An increase in speed, feed and depth of cut has become more conspicuous in cutting in recent times, and the plastic-deformation resistance of the cutting tool disclosed in JP2017-024165 A is required to be further improved. In particular, there has been a growth in cutting which places a load on a cutting tool or a coated cutting tool obtained by forming a coating layer on a surface of a cutting tool, such as high-speed cutting of steel, and under such severe cutting conditions, a conventional cutting tool is likely to involve the progress of wear due to plastic deformation. This triggers a problem in that the tool life cannot be extended. In order to solve the above-described problem, it is possible to consider varying the composition of the cemented carbide and thereby increasing the hardness; however, a variation of the composition of the cemented carbide alone leads to a reduction in the toughness of the tool, thereby resulting in a reduction in the fracture resistance thereof.

An object of the present invention is to provide a cemented carbide and a coated cemented carbide which each have excellent wear resistance and fracture resistance and which accordingly allow for an extended tool life.

Solution to Problem

The present invention has been made in order to solve the above problem, and various studies have been conducted regarding a cemented carbide and a coated cemented carbide. As a result, the present inventor has found that such problem can be solved by providing a predetermined hard phase, a predetermined binder phase and a predetermined composite compound phase at respective predetermined ratios and controlling the maximum particle size of an aggregate contained in the composite compound phase and the particle size distribution of such aggregate, and this has led to the completion of the present invention.

Namely, the gist of the present invention is as set forth below:

[1] A cemented carbide comprising: a hard phase containing tungsten carbide as its main component; a binder phase containing an element of at least one kind selected from the group consisting of Co, Ni and Fe as its main component; and a composite compound phase containing at least one kind from among a carbide, a nitride and a carbonitride of an element of one kind selected from the group consisting of Ti, Zr, Hf, V, Nb, Ta, Cr and Mo as its main component, wherein:

based on total contents of the hard phase, the binder phase and the composite compound phase in the cemented carbide, a content ratio of the hard phase is from 70 volume % or more to 85 volume % or less, a content ratio of the binder phase is from 7.0 volume % or more to 17.0 volume % or less, and a content ratio of the composite compound phase is from 5.0 volume % or more to 15.0 volume % or less;

the composite compound phase comprises an aggregate;

the aggregate comprises a small-diameter aggregate having a longest diameter of from 10 μm or more to below 30 μm and a large-diameter aggregate having a longest diameter of 30 μm or more;

a cross-sectional structure of a surface region which ranges inward from a surface of the cemented carbide to a depth of 100 μm satisfies a condition represented by formula (1A) below; and a cross-sectional structure of an inner region further inward than the surface region satisfies a condition represented by formula (2A) below.

$$0.5 \le S_{SDA} \le 4.0 \quad (1A)$$

(In the formula, $S_{SDA}$ refers to a ratio (unit:area %) of a cross-sectional area of the small-diameter aggregate based on a total cross-sectional area of the composite compound phase.)

$$1.0 \le I_{LDA} \le 6.0 \quad (2A)$$

(In the formula, $I_{LDA}$ refers to a ratio (unit:area %) of a cross-sectional area of the large-diameter aggregate based on a total cross-sectional area of the composite compound phase.)

[2] The cemented carbide according to [1], wherein a cross-sectional structure of the surface region satisfies a condition represented by formula (2B) below.

$$S_{LDA} \leq 1.0 \quad (2B)$$

(In the formula, $S_{LDA}$ refers to a ratio (unit:area %) of a cross-sectional area of the large-diameter aggregate based on a total cross-sectional area of the composite compound phase.)

[3] The cemented carbide according to [1] or [2], wherein a cross-sectional structure of the inner region satisfies a condition represented by formula (1B) below.

$$0.5 \leq I_{SDA} \leq 2.0 \quad (1B)$$

(In the formula, $I_{SDA}$ refers to a ratio (unit:area %) of a cross-sectional area of the small-diameter aggregate based on a total cross-sectional area of the composite compound phase.)

[4] The cemented carbide according to any of [1] to [3], wherein an average particle size of the tungsten carbide is from 1.5 μm or more to 3.0 μm or less.

[5] A coated cemented carbide comprising the cemented carbide according to any of [1] to [4] and a coating layer formed on a surface of the cemented carbide.

[6] The coated cemented carbide according to [5], wherein an average thickness of the coating layer is from 3 μm or more to 20 μm or less.

Advantageous Effects of Invention

The present invention can provide a cemented carbide and a coated cemented carbide which each have excellent wear resistance and fracture resistance and which accordingly allow for an extended tool life.

DESCRIPTION OF EMBODIMENTS

An embodiment for carrying out the present invention (hereinafter simply referred to as the "present embodiment") will hereinafter be described in detail, with reference to the attached drawings as appropriate. However, the present invention is not limited to the present embodiment below. Various modifications may be made to the present invention without departing from the gist of the invention.

A cemented carbide according to the present embodiment is a cemented carbide comprising: a hard phase containing tungsten carbide as its main component; a binder phase containing an element of at least one kind selected from the group consisting of Co, Ni and Fe as its main component; and a composite compound phase containing at least one kind from among a carbide, a nitride and a carbonitride of an element of one kind selected from the group consisting of Ti, Zr, Hf, V, Nb, Ta, Cr and Mo as its main component, wherein: based on total contents of the hard phase, the binder phase and the composite compound phase in the cemented carbide, a content ratio of the hard phase is from 70 volume % or more to 85 volume % or less, a content ratio of the binder phase is from 7.0 volume % or more to 17.0 volume % or less, and a content ratio of the composite compound phase is from 5.0 volume % or more to 15.0 volume % or less; the composite compound phase comprises an aggregate; the aggregate comprises a small-diameter aggregate having a longest diameter of from 10 μm or more to below 30 μm and a large-diameter aggregate having a longest diameter of 30 μm or more; a cross-sectional structure of a surface region which ranges inward from a surface of the cemented carbide to a depth of 100 μm (hereinafter also simply referred to as a "surface region") satisfies a condition represented by formula (1A) below; and a cross-sectional structure of an inner region further inward than the surface region (hereinafter also simply referred to as an "inner region") satisfies a condition represented by formula (2A) below.

$$0.5 \leq S_{SDA} \leq 4.0 \quad (1A)$$

(In the formula, $S_{SDA}$ refers to a ratio (unit:area %) of a cross-sectional area of the small-diameter aggregate based on a total cross-sectional area of the composite compound phase.)

$$1.0 \leq I_{LDA} \leq 6.0 \quad (2A)$$

(In the formula, $I_{LDA}$ refers to a ratio (unit:area %) of a cross-sectional area of the large-diameter aggregate based on a total cross-sectional area of the composite compound phase.)

The cemented carbide of the present embodiment comprises the above-described configurations, and this allows the wear resistance and fracture resistance of the cemented carbide to be improved; as a result, the tool life thereof can be extended. The factors for the improvements in wear resistance and fracture resistance of the cemented carbide of the present embodiment can be considered to be set forth as follows. However, the present invention is not in any way limited by the factors set forth below.

(1) If the content ratio of the hard phase is 70 volume % or more, this leads to improved hardness, thereby resulting in improved plastic-deformation resistance. Accordingly, wear is less likely to progress, thereby leading to improved wear resistance. Further, if the content ratio of the hard phase is 85 volume % or less, this leads to improved toughness, thereby resulting in improved fracture resistance.

(2) If the content ratio of the binder phase is 7.0 volume % or more, this leads to improved toughness, thereby resulting in improved fracture resistance. Meanwhile, if the content ratio of the binder phase is 17.0 volume % or less, this leads to improved hardness, thereby resulting in improved plastic-deformation resistance. Accordingly, wear is less likely to progress, thereby leading to improved wear resistance.

(3) If the content ratio of the composite compound phase is 5.0 volume % or more, this leads to improved hardness, thereby resulting in improved plastic-deformation resistance. Accordingly, wear is less likely to progress, thereby leading to improved wear resistance. Meanwhile, if the content ratio of the composite compound phase is 15.0 volume % or less, this leads to improved toughness, thereby resulting in improved fracture resistance.

(4) The composite compound phase comprising the aggregate leads to locally improved hardness, thereby resulting in improved plastic-deformation resistance. Accordingly, wear is less likely to progress, thereby leading to improved wear resistance.

(5) If $S_{SDA}$ is 0.5 area % or more, this leads to locally improved hardness of the surface region, thereby resulting in improved plastic-deformation resistance. Accordingly, wear is less likely to progress, thereby leading to improved wear resistance. Meanwhile, if $S_{SDA}$ is 4.0 area % or less, the aggregate of the composite compound phase which may become an origin of destruction is less likely to appear, and this leads to improved toughness of the surface region, thereby resulting in improved fracture resistance.

(6) If $I_{LDA}$ is 1.0 area % or more, this leads to improved hardness of the inner region, thereby resulting in improved plastic-deformation resistance. Accordingly, wear is less likely to progress, thereby leading to improved wear resistance. Meanwhile, if $I_{LDA}$ is 6.0 area % or less, the aggregate of the composite compound phase which may become an origin of destruction is less likely to appear, and this leads to improved toughness of the inner region, thereby resulting in excellent fracture resistance.

[Hard Phase]

The hard phase in the cemented carbide of the present embodiment contains tungsten carbide as its main component. Herein, the term "main component" indicates that, when regarding the entire hard phase as constituting 100 volume %, such main component constitutes over 50 volume %. When regarding the entire hard phase as constituting 100 volume %, the content of the tungsten carbide in the hard phase is preferably 70 volume % or more, is more preferably 85 volume % or more, and is further preferably 100 volume % (i.e., the hard phase consists of tungsten carbide).

The average particle size of the tungsten carbide is preferably from 1.5 μm or more to 3.0 μm or less. Such average particle size being 1.5 μm or more leads to further excellent toughness, thereby resulting in the tendency of the fracture resistance to be further improved. Such average particle size being 3.0 μm or less leads to further improved hardness, thereby resulting in the tendency of the wear resistance to be further improved.

The average particle size of the tungsten carbide in the cemented carbide may, for example, be measured by the method set forth below. That is, the cemented carbide is polished in a direction orthogonal to a surface thereof, and the resulting arbitrary cross-sectional structure is magnified from 2,000 times or more to 5,000 times or less using an SEM, and the resulting cross-sectional structure of the cemented carbide is observed via a backscattered electron image. Thereafter, a photograph is taken of the above arbitrary cross-sectional structure. A large number of lines are drawn at random on the obtained photograph of the cross-sectional structure, and then the particle sizes of all the tungsten particles traversed by such lines can be obtained with the Fullman formula (J. Metals, March 1953, 447).

[Binder Phase]

The binder phase in the cemented carbide of the present embodiment contains an element of at least one kind selected from the group consisting of Co, Ni and Fe as its main component. Herein, the term "main component" indicates that, when regarding the entire binder phase as constituting 100 volume %, such main component constitutes over 50 volume %. When regarding the entire binder phase as constituting 100 volume %, the content of the above element in the binder phase is preferably 75 volume % or more, is more preferably 90 volume % or more, and is further preferably 100 volume % (i.e., the binder phase consists of an element of at least one kind selected from the group consisting of Co, Ni and Fe).

The binder phase in the cemented carbide of the present embodiment preferably contains Co as its main component. The binder phase containing Co as its main component leads to further improved sinterability and further improved toughness of the cemented carbide, thereby resulting in the tendency of the fracture resistance of the tool to be further excellent.

[Composite Compound Phase]

The composite compound phase in the cemented carbide of the present embodiment further contains a composite compound of one or more kinds from among a carbide, a nitride and a carbonitride of a metal element of at least one kind selected from the group consisting of Ti, Zr, Hf, V, Nb, Ta, Cr and Mo. This leads to improved wear resistance and plastic-deformation resistance. From the same perspective, the above composite compound is more preferably comprised of one or more kinds from among a carbide, a nitride and a carbonitride of a metal element of at least one kind selected from the group consisting of Ti, Zr, V, Nb, Ta and Cr, and is further preferably comprised of one or more kinds selected from the group consisting of TiN, TiC, ZrCN, VC, NbC, TaC and $Cr_3C_2$.

(Aggregate)

Figure 1:
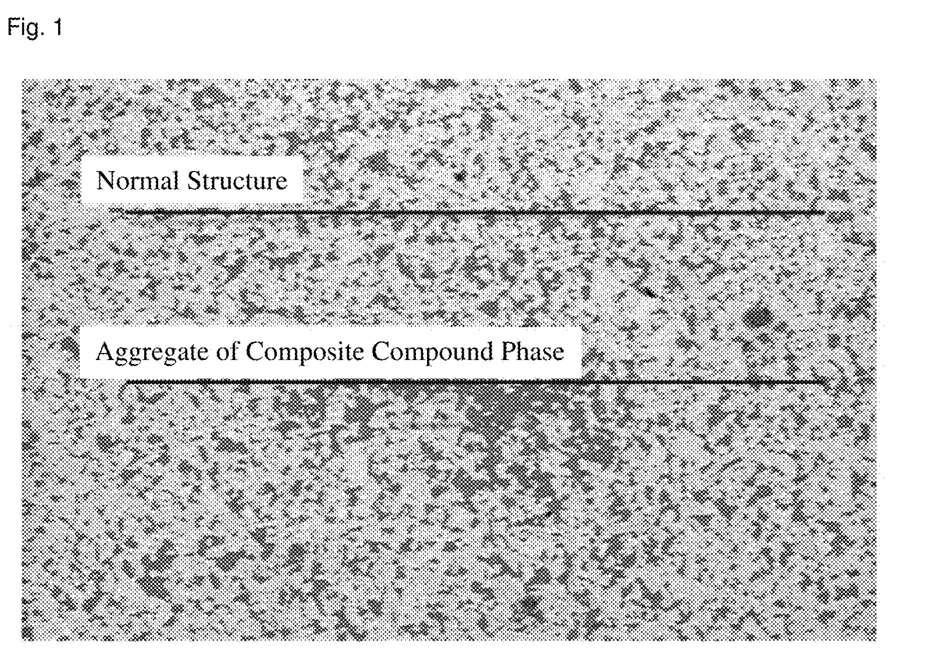
FIG. 1 shows a backscattered electron image showing an example of a cross-sectional structure in a cemented carbide.
Figure 2:
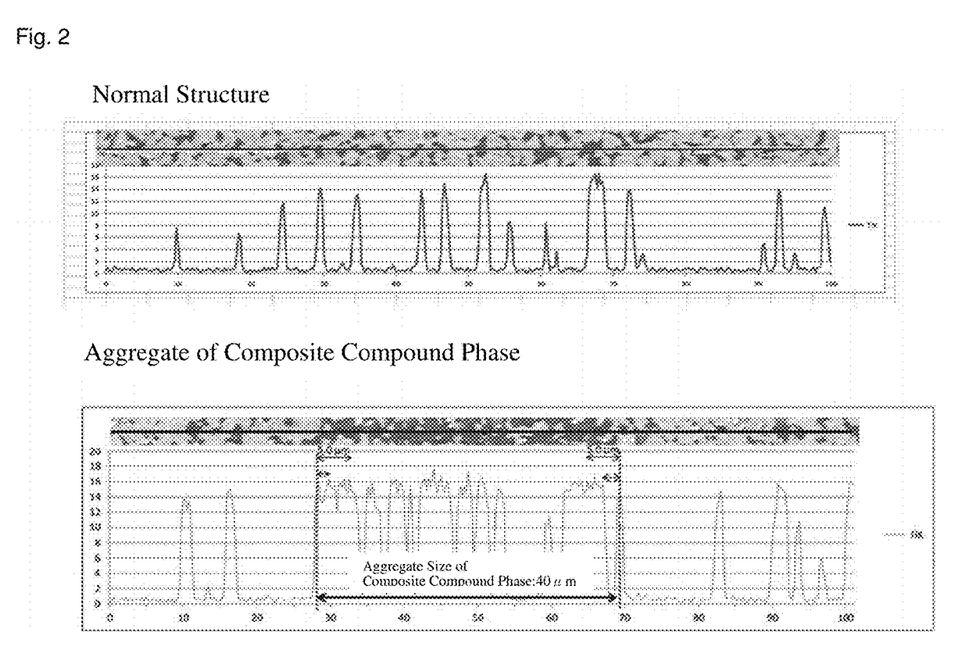
FIG. 2 includes: an upper view illustrating EDS element analysis data obtained by scanning a line of a normal structure in the backscattered electron image of FIG. 1; and a lower view illustrating EDS element analysis data obtained by scanning a line of an MC (composite compound phase) aggregate in the backscattered electron image of FIG. 1.

The composite compound phase of the present embodiment comprises an aggregate. The term "aggregate" in this specification is defined as set forth below. That is, the cemented carbide is polished in a direction orthogonal to a surface thereof, and the resulting arbitrary cross-sectional structure at one location is magnified from 2,000 times or more to 5,000 times or less using a scanning electron microscope (SEM) provided with an energy-dispersive X-ray spectroscope (EDS), and the resulting cross-sectional structure of the cemented carbide is observed via a backscattered electron image. Next, with the EDS attached to the SEM, line analysis is performed with a measurement length of approximately 100 μm, thereby measuring peak-to-peak distances derived from the composite compound which constitutes the composite compound phase. Here, when peaks with a peak-to-peak distance of 5.0 μm or less are located in a consecutive manner, it is assumed that an aggregate is formed within a range involving, from among the consecutive peaks, the first peak top as a starting point and the last peak top as an end point. Specific examples are shown in FIGS. 1 and 2. FIG. 1 shows a backscattered electron image of an arbitrary 5,000-fold magnified cross-sectional structure of the cemented carbide of the present embodiment. The upper view of FIG. 2 shows EDS element analysis data concerning a line of a normal structure of the backscattered electron image of FIG. 1, and the lower view of FIG. 2 shows EDS element analysis data concerning a line of an MC (composite compound phase) aggregate of the backscattered electron image of FIG. 1. Here, as to the EDS element analysis data of the lower view, it is assumed that such data involves a range covering consecutive peaks with a peak-to-peak distance of 5.0 μm or less and that an aggregate is formed in such range. Further, according to the EDS element analysis data shown in FIG. 2, the particle size of the aggregate formed in the above range can be calculated as approximately 40 μm, as shown in the lower view of FIG. 2.

(Small-diameter Aggregate)

The small-diameter aggregate of the present embodiment has a longest diameter of from 10 μm or more to below 30 μm. In this small-diameter aggregate, a cross-sectional structure of a surface region which ranges inward from a surface of the cemented carbide to a depth of 100 μm satisfies a condition represented by formula (1A) below.

$$0.5 \leq S_{SDA} \leq 4.0 \tag{1A}$$

(In the formula, $S_{SDA}$ refers to a ratio (unit:area %) of a cross-sectional area of the small-diameter aggregate based on a total cross-sectional area of the composite compound phase.)

If $S_{SDA}$ is 0.5 area % or more, this leads to improved hardness of the surface region, thereby resulting in improved plastic-deformation resistance. Accordingly, wear is less likely to progress, thereby leading to improved wear resistance. Meanwhile, if $S_{SDA}$ is 4.0 area % or less, this leads to improved toughness of the surface region, thereby resulting in improved fracture resistance. From the same perspective, $S_{SDA}$ is preferably from 1.0 area % or more to 3.9 area % or less, and is more preferably from 1.5 area % or more to 3.5 area % or less.

In the small-diameter aggregate of the present embodiment, a cross-sectional structure of the inner region preferably satisfies a condition represented by formula (1B) below.

$$0.5 \leq I_{SDA} \leq 2.0 \tag{1B}$$

(In the formula, $I_{SDA}$ refers to a ratio (unit:area %) of a cross-sectional area of the small-diameter aggregate based on a total cross-sectional area of the composite compound phase.)

If $I_{SDA}$ is 0.5 area % or more, this leads to further improved hardness of the inner region, thereby resulting in the tendency of the plastic-deformation resistance to be further improved. Accordingly, wear is less likely to progress, thereby resulting in the tendency of the wear resistance to be improved. Meanwhile, if $I_{SDA}$ is 2.0 area % or less, this leads to further improved toughness of the inner region, thereby resulting in the tendency of the fracture resistance to be further excellent. From the same perspective, $I_{SDA}$ is preferably from 0.7 area % or more to 2.0 area % or less.

(Large-diameter Aggregate)

The large-diameter aggregate of the present embodiment has a longest diameter of 30 μm or more. In this large-diameter aggregate, a cross-sectional structure of a surface region which ranges inward from a surface of the cemented carbide to a depth of 100 μm satisfies a condition represented by formula (2A) below.

$$1.0 \leq I_{LDA} \leq 6.0 \tag{2A}$$

(In the formula, $I_{LDA}$ refers to a ratio (unit:area %) of a cross-sectional area of the large-diameter aggregate based on a total cross-sectional area of the composite compound phase.)

If $I_{LDA}$ is 1.0 area % or more, this leads to improved hardness of the inner region, thereby resulting in improved plastic-deformation resistance. Accordingly, wear is less likely to progress, thereby leading to improved wear resistance. Meanwhile, if $I_{LDA}$ is 6.0 area % or less, this leads to improved toughness of the inner region, thereby resulting in excellent fracture resistance. From the same perspective, $I_{LDA}$ is preferably from 1.1 area % or more to 5.5 area % or less, and is more preferably from 1.5 area % or more to 5.0 area % or less.

A cross-sectional structure of the surface region preferably satisfies a condition represented by formula (2B) below.

$$S_{LDA} \leq 1.0 \tag{2B}$$

(In the formula, $S_{LDA}$ refers to a ratio (unit:area %) of a cross-sectional surface of the large-diameter aggregate based on a total cross-sectional area of the composite compound phase.)

If $S_{LDA}$ is 1.0 area % or more, this leads to further improved toughness of the surface region, thereby resulting in the tendency of the fracture resistance to be further excellent. From the same perspective, $S_{LDA}$ is more preferably from 0.5 area % or less (for example, from 0 area % or more to 0.5 area % or less).

$S_{SDA}$, $I_{SDA}$, $S_{LDA}$ and $I_{LDA}$ may, for example, be measured by the method set forth below. That is, the cemented carbide is polished in a direction orthogonal to a surface thereof, and the resulting arbitrary cross-sectional structure is magnified from 2,000 times or more to 5,000 times or less using an SEM, and the resulting cross-sectional structure of the cemented carbide is observed via a backscattered electron image. Thereafter, a photograph is taken of the above arbitrary cross-sectional structure. $S_{SDA}$, $I_{SDA}$, $S_{LDA}$ and $I_{LDA}$ can be obtained from the resulting photograph of the cross-sectional structure, using commercially available image analysis software.

[Content Ratio of Each Phase]

A content ratio of the hard phase based on total contents of the hard phase, the binder phase and the composite compound phase in the cemented carbide is from 70 volume % or more to 85 volume % or less. If the content ratio of the hard phase is 70 volume % or more, this leads to improved hardness, thereby resulting in improved plastic-deformation resistance. Accordingly, wear is less likely to progress, thereby leading to improved wear resistance. Further, if the content ratio of the hard phase is 85 volume % or less, this leads to improved toughness, thereby resulting in improved fracture resistance. From the same perspective, the content ratio of the hard phase is more preferably from 75 volume % or more to 80 volume % or less.

A content ratio of the binder phase based on total contents of the hard phase, the binder phase and the composite compound phase in the cemented carbide is from 7.0 volume % or more to 17.0 volume % or less. If the content ratio of the binder phase is 7.0 volume % or more, this leads to improved toughness, thereby resulting in improved fracture resistance. Meanwhile, if the content ratio of the binder phase is 17.0 volume % or less, this leads to improved hardness, thereby resulting in improved plastic-deformation resistance. Accordingly, wear is less likely to progress, thereby leading to improved wear resistance. From the same perspective, the content ratio of the binder phase is preferably from 8.0 volume % or more to 15.0 volume % or less.

A content ratio of the composite compound phase based on total contents of the hard phase, the binder phase and the composite compound phase in the cemented carbide is from 5.0 volume % or more to 15.0 volume % or less. If the content ratio of the composite compound phase in the cemented carbide is 5.0 volume % or more, this leads to improved hardness, thereby resulting in improved plastic-deformation resistance. Accordingly, wear is less likely to progress, thereby leading to improved wear resistance. Meanwhile, if the content ratio of the composite compound phase is 15.0 volume % or less, this leads to improved hardness, thereby resulting in improved fracture resistance. From the same perspective, the content ratio of the composite compound phase is preferably from 8.0 volume % or more to 13.0 volume % or less.

The composition of each of the hard phase, the binder phase and the composite compound phase in the cemented carbide of the present embodiment and the content ratio (volume %) thereof are obtained as set forth below. Arbitrary cross-sectional structures located at at least three locations inside the cemented carbide (cross-sectional structures located inward within not less than 500 μm in depth below the surface of the cemented carbide) are observed with a scanning electron microscope (SEM) provided with an energy-dispersive X-ray spectroscope (EDS), and the composition of each of the hard phase, the binder phase and the composite compound phase in the cemented carbide is measured with the EDS. The results can be used to obtain the respective ratios of the hard phase, the binder phase and the composite compound phase in the cemented carbide. That is, the cemented carbide is polished in a direction orthogonal to a surface thereof, and the resulting arbitrary cross-sectional structures are observed with the SEM, and using the EDS attached to the SEM, the composition of each phase in the cemented carbide and the content ratio (volume %) thereof are obtained. More specifically, the above arbitrary cross-sectional structures in the cemented carbide are magnified approximately from 2,000 times or more to 5,000 times or less using a scanning electron microscope (SEM) provided with an energy-dispersive X-ray spectroscope (EDS), and the resulting cross-sectional structures of the cemented carbide are observed via backscattered electron images. Next, with the EDS attached to the SEM, it can be determined that a white region refers to a hard phase, a dark gray region refers to a binder phase, and a light gray region refers to a composite compound phase. Thereafter, photographs are taken of the arbitrary cross-sectional structures. From the obtained photographs of the cross-sectional structures, it is possible to obtain the content ratio (volume %) of each phase, using commercially available image analysis software. It should be noted that the content ratio of each phase can be obtained as, for example, the arithmetic mean of the content ratios concerning the cross-sectional structures at three locations.

[Coated Cemented Carbide]

The coated cemented carbide of the present embodiment comprises the cemented carbide of the present embodiment and a coating layer formed on a surface of the cemented carbide. Such coated cemented carbide has further improved wear resistance. The coating layer may be a single layer or a laminate of two or more layers.

The average thickness of the coating layer of the present embodiment is preferably from 3 μm or more to 20 μm or less. There is a tendency that, if such average thickness is 3.0 μm or more, this leads to further improved wear resistance, whereas, if the average thickness is 20 μm or less, this leads to further improved fracture resistance. From the same perspective, the average thickness is preferably from 5 μm or more to 18 μm or less, and is more preferably from 10 μm or more to 16 μm or less.

The coating layer of the present embodiment is not particularly limited, as long as it can be used as a coating layer of a coated tool. For example, such coating layer may comprise: a lower layer including one or more Ti compound layers containing a Ti compound of Ti and an element of at least one kind selected from the group consisting of C, N, O and B; an α-type $Al_2O_3$ layer containing α-type $Al_2O_3$; and an upper layer including a Ti compound layer containing a Ti carbide, a Ti nitride or a Ti carbonitride, and the respective layers may be laminated in this order from the cemented carbide's surface side toward the coating layer's surface side. Further, the coating layer does not necessarily comprise both the lower layer and the upper layer and may instead comprise only either the lower layer or the upper layer.

(Lower Layer)

The lower layer of the present embodiment includes one or more Ti compound layers containing a Ti compound of Ti and an element of at least one kind selected from the group consisting of C, N, O and B. The lower layer is preferably provided between a cemented carbide and an intermediate layer containing α-type aluminum oxide because this leads to further improved wear resistance and adhesion. Examples of the Ti compound layer include a TiC layer containing TiC, a TiN layer containing TiN, a TiCN layer containing TiCN, a TiCO layer containing TiCO, a TiCNO layer containing TiCNO, a TiON layer containing TiON and a $TiB_2$ layer containing $TiB_2$. The lower layer may be constituted by a single layer or multiple layers (for example, two or three layers). However, the lower layer is preferably constituted by multiple layers, is more preferably constituted by two or three layers, and is further preferably constituted by three layers. The lower layer, from the perspective of further improving wear resistance and adhesion, preferably comprises a layer of at least one kind selected from the group consisting of a TiN layer, a TiC layer, a TiCN layer, a TiCNO layer, a TiON layer and a $TiB_2$ layer, and at least one layer of the lower layer is preferably a TiCN layer because this leads to further improved wear resistance. When the lower layer is constituted by three layers: a TiC layer or a TiN layer, serving as a first layer, may be formed on a surface of the cemented carbide of the present embodiment as a substrate; a TiCN layer, serving as a second layer, may be formed on a surface of the first layer; and a TiCNO layer or a TiCO layer, serving as a third layer, may be formed on a surface of the second layer. In particular, as to the lower layer: a TiN layer, serving as a first layer, may be formed on a surface of a substrate; a TiCN layer, serving as a second layer, may be formed on a surface of the first layer; and a TiCNO layer, serving as a third layer, may be formed on a surface of the second layer.

The average thickness of the TiC layer or the TiN layer, from the perspective of further improving wear resistance and fracture resistance, is preferably from 0.05 μm or more to 1.0 μm or less. The average thickness of the TiCN layer, from the perspective of further improving wear resistance and fracture resistance, is preferably from 2.0 μm or more to 15.0 μm or less. The average thickness of the TiCNO layer or the TiCO layer, from the perspective of further improving wear resistance and fracture resistance, is preferably from 0.1 μm or more to 1.0 μm or less. The average thickness of the lower layer of the present embodiment, from the perspective of further improving wear resistance and fracture resistance, is preferably from 3.0 μm or more to 15.0 μm or less.

(Intermediate Layer)

The intermediate layer of the present embodiment includes an α-type $Al_2O_3$ layer containing α-type $Al_2O_3$. The average thickness of the intermediate layer of the present embodiment, from the perspective of further improving wear resistance and fracture resistance, is preferably from 3.0 μm or more to 15.0 μm or less.

(Upper Layer)

The upper layer of the present embodiment includes a Ti compound layer containing a Ti carbide, a Ti nitride or a Ti carbonitride. The upper layer is preferably provided because this leads to further improved wear resistance. From the same perspective, the upper layer preferably includes a TiN layer containing a Ti nitride. The average thickness of the upper layer, from the perspective of further improving wear resistance and fracture resistance, is preferably from 0.1 μm or more to 1.0 μm or less.

The thickness of each layer which constitutes the coating layer and the thickness of the entire coating layer according to the present embodiment can be measured from a cross-sectional structure of the coated cemented carbide, using an optical microscope, a SEM, a transmission electron microscope (TEM), or the like. It should be noted that, as to the average thickness of each layer and the average thickness of the entire coating layer in the coated cemented carbide of the present embodiment, such average thicknesses can be obtained by measuring the thickness of each layer and the thickness of the entire coating layer, from each of the cross-sectional surfaces at three or more locations, and calculating the average value of the resulting measurements.

The composition of each layer which constitutes the coating layer in the coated cemented carbide of the present embodiment can be determined, from a cross-sectional structure of the coated cemented carbide of the present embodiment, via measurements with an EDS, a wavelength-dispersive X-ray spectroscope (WDS), or the like.

A method of manufacturing a cemented carbide and a coated cemented carbide according to the present embodiment will now be described using specific examples. It should be noted that the method of manufacturing a cemented carbide and a coated cemented carbide according to the present embodiment is not particularly limited, as long as the configurations of the cemented carbide may be achieved.

For example, the method of manufacturing a cemented carbide and a coated cemented carbide according to the present embodiment may include the steps set forth below. However, such manufacturing method of the present embodiment does not necessarily include all the steps set forth below and may not include some of such steps.

Step (1-1): a step of formulating: 70 volume % or more to 85.0 volume % or less of a tungsten carbide powder with an average particle size of from 1.5 μm or more to 5.0 μm or less; 7.0 volume % or more to 17.0 volume % or less of a metal powder of at least one kind selected from the group consisting of Co, Ni and Fe with an average particle size of from 0.5 μm or more to 3.0 μm or less; and 5.0 volume % or more to 15.0 volume % or less of a composite compound powder of at least one kind from among a carbide, a nitride and a carbonitride of one kind selected from the group consisting of Ti, Zr, Hf, V, Nb, Ta, Cr and Mo with an average particle size of from 0.5 μm or more to 5.0 μm or less (the total should be 100 volume %), and thereby obtaining formulated powders.

Step (1-2): a mixing step of mixing the formulated powders prepared in step (1-1) together with a hexane solvent and paraffin with an average particle size of approximately 30 μm by means of a wet ball mill for 10 hours or more to 40 hours or less, and thereby obtaining a mixture. In this step, the content of the paraffin is, for example, from 1.0 mass % or more to 3.0 mass % or less based on 100 mass % of the total amount of the formulated powders and the paraffin.

Step (1-3): a step of spray-draying the mixture obtained in step (1-2) in a nitrogen stream at a drying temperature of from 100° C. or higher to 200° C. or lower, and thereby obtaining solid granules having no pores therein (also referred to as "normal granules").

Step (2-1): a step of formulating: 70.0 volume % or more to 85.0 volume % or less of a tungsten carbide powder with an average particle size of from 1.5 μm or more to 5.0 μm or less; 7.0 volume % or more to 17.0 volume % or less of a metal powder of at least one kind selected from the group consisting of Co, Ni and Fe with an average particle size of from 0.5 μm or more to 3.0 μm or less; and 5.0 volume % or more to 15.0 volume % or less of a composite compound powder of at least one kind from among a carbide, a nitride and a carbonitride of one kind selected from the group consisting of Ti, Zr, Hf, V, Nb, Ta, Cr and Mo with an average particle size of from 0.5 μm or more to 5.0 μm or less (the total should be 100 volume %), and thereby obtaining formulated powders.

Step (2-2): a mixing step of mixing the formulated powders prepared in step (2-1) together with an alcohol solvent and paraffin with an average particle size of less than 30 μm by means of a wet ball mill for 10 hours or more to 40 hours or less, and thereby obtaining a mixture. In this step, the content of the paraffin is, for example, approximately from 1.0 mass % or more to 3.0 mass % or less based on 100 mass % of the total amount of the formulated powders and the paraffin.

Step (2-3): a step of spray-draying the mixture obtained in step (2-2) in a nitrogen stream at a drying temperature of from 100° C. or higher to 200° C. or lower, and thereby obtaining hollow granules having small-diameter pores (also referred to as "small-diameter granules").

Step (3-1): a step of formulating: 70.0 volume % or more to 85.0 volume % or less of a tungsten carbide powder with an average particle size of from 1.5 μm or more to 5.0 μm or less; 7.0 volume % or more to 17.0 volume % or less of a metal powder of at least one kind selected from the group consisting of Co, Ni and Fe with an average particle size of from 0.5 μm or more to 3.0 μm or less; and 5.0 volume % or more to 15.0 volume % or less of a composite compound powder of at least one kind from among a carbide, a nitride and a carbonitride of one kind selected from the group consisting of Ti, Zr, Hf, V, Nb, Ta, Cr and Mo with an average particle size of from 0.5 μm or more to 5.0 μm or less (the total should be 100 volume %), and thereby obtaining formulated powders.

Step (3-2): a mixing step of mixing the formulated powders prepared in step (3-1) together with an alcohol solvent and paraffin with an average particle size of 30 μm or more by means of a wet ball mill for 10 hours or more to 40 hours or less, and thereby obtaining a mixture. In this step, the content of the paraffin is, for example, from 1.0 mass % or more to 3.0 mass % or less based on 100 mass % of the total amount of the formulated powders and the paraffin.

Step (3-3): a step of spray-draying the mixture obtained in step (3-2) in a nitrogen stream at a drying temperature of from 100° C. or higher to 200° C. or lower, and thereby obtaining hollow granules having large-diameter pores (also referred to as "large-diameter granules").

Step (4): a formulation step of formulating 5 mass % or more to 69 mass % or less of the normal granules, 6 mass % or more to 49 mass % or less of the small-diameter granules, and 0 mass % or more to 70 mass % or less of the large-diameter granules, which have been obtained in the above steps so as to constitute 100 mass % for a total of the respective granules, and thereby obtaining formulated granules.

Step (5): a mixing step of placing the formulated granules obtained in step (4) into a mixing container and mixing such formulated granules for 5 minutes or more to 10 minutes or less, and thereby obtaining a mixture.

Step (6): a molding step of press-molding the mixture obtained in step (5) into a predetermined tool shape under the condition of a load of from 2 t or more to 3 t or less, and thereby obtaining a molded body.

Step (7-1): a temperature raising step of raising the temperature of the molded body obtained in step (6) so as to reach a temperature of from 1,400° C. or higher to 1,500° C. or lower at a rate of 5° C./min or higher to 20° C./min or lower under a vacuum condition of 70 Pa or lower.

Step (7-2): a sintering step of holding the molded body which has undergone step (7-1) at a temperature of from 1,400° C. or higher to 1,500° C. or lower and sintering such molded body for 30 minutes or more to 120 minutes or less under a vacuum condition of 70 Pa or lower.

Step (7-3): a cooling step of cooling the molded body which has undergone step (7-2) from a temperature of from 1,400° C. or higher to 1,500° C. or lower to room temperature at a rate of 5° C./min or higher to 30° C./min or lower under a vacuum condition of 70 Pa or lower.

It should be noted that the average particle sizes of the respective raw material powders were measured by the Fisher method (Fisher Sub-Sieve Sizer (FSSS)) indicated in standard B330 of the American Society for Testing and Materials (ASTM).

The above steps each have the respective meanings set forth below.

In step (1-1), a tungsten carbide powder, a metal powder of at least one kind selected from the group consisting of Co, Ni and Fe, and a composite compound powder of at least one kind from among a carbide, a nitride and a carbonitride of one kind selected from the group consisting of Ti, Zr, Hf, V, Nb, Ta, Cr and Mo, are used at predetermined formulation ratios, thereby making it possible to obtain granules with a composition falling within a specific range and with an average particle size falling within a specific range in each phase.

In step (1-2), a hexane solvent is used for the production of granules through spray drying in step (1-3), as a result of which granules having no pores therein can be produced. Further, mixing is conducted with a wet ball mill, thereby making it possible to obtain granules having a uniform structure without the aggregation of respective phases (in particular, a hard phase and a binder phase) and having an average particle size falling within a specific range in each phase.

In step (1-3), the mixture is subjected to spray drying, thereby making it possible to obtain granules in which the solvent has been evaporated.

In step (2-1), a tungsten carbide powder, a metal powder of at least one kind selected from the group consisting of Co, Ni and Fe, and a composite compound powder of at least one kind from among a carbide, a nitride and a carbonitride of one kind selected from the group consisting of Ti, Zr, Hf, V, Nb, Ta, Cr and Mo, are used at predetermined formulation ratios, thereby making it possible to obtain granules with a composition falling within a specific range and with an average particle size falling within a specific range in each phase.

In step (2-2), an alcohol solvent (preferably methanol, ethanol and propanol) is used for the production of granules through spray drying in step (2-3), as a result of which, granules having pores therein (hollow granules) can be produced. Paraffin with an average particle size of less than 30 µm is also used, as a result of which the diameter of the pores of the hollow granules can be decreased. Further, mixing is conducted with a wet ball mill, thereby making it possible to obtain granules having a uniform structure without the aggregation of the respective phases (in particular, the hard phase and the binder phase) and having an average particle size falling within a specific range in each phase.

In step (2-3), the mixture is subjected to spray drying, thereby making it possible to obtain granules in which the solvent has been evaporated.

In step (3-1), a tungsten carbide powder, a metal powder of at least one kind selected from the group consisting of Co, Ni and Fe, and a composite compound powder of at least one kind from among a carbide, a nitride and a carbonitride of one kind selected from the group consisting of Ti, Zr, Hf, V, Nb, Ta, Cr and Mo, are used at predetermined formulation ratios, thereby making it possible to obtain granules with a composition falling within a specific range and with an average particle size falling within a specific range in each phase.

In step (3-2), an alcohol solvent is used for the production of granules through spray drying in step (3-3), as a result of which granules having pores therein (hollow granules) can be produced. Paraffin with an average particle size of 30 µm or more is used, as a result of which the diameter of the pores of the hollow granules can be increased. Further, mixing is conducted with a wet ball mill, thereby making it possible to obtain granules having a uniform structure without the aggregation of the respective phases (in particular, the hard phase and the binder phase) and having an average particle size falling within a specific range in each phase.

In step (3-3), the mixture is subjected to spray drying, thereby making it possible to obtain granules in which the solvent has been evaporated.

The respective granules preferably have the same composition.

In step (4), the respective granules are formulated at predetermined formulation ratios, thereby making it possible to obtain a molded body or cemented carbide with a composition falling within a specific range and with an average particle size falling within a specific range in each phase. Further, the respective granules are formulated at predetermined ratios, thereby making it possible to adjust the ratio of cross-sectional area of each aggregate in the composite compound phase in the resulting molded body or cemented carbide.

In step (5), it is possible to obtain a molded body or cemented carbide having a uniform structure without the aggregation of the respective phases (in particular, the hard phase and the binder phase).

In step (6), the mixture is press-molded under a predetermined condition, thereby making it possible to obtain a molded body with a predetermined cutting tool shape. Further, when press-molding the mixture under such predetermined condition, the surface region involves a greater press load than that involved in the inner region during pressing, thereby resulting in the tendency of the hollow granules in the surface region to be likely to be crushed. This makes it possible to obtain a molded body with a pore size distribution in which the pore size of the pores in the surface region is small and the pore size of the pores in the inner region is large.

In step (7-1), the temperature of the molded body is raised in a vacuum of 70 Pa or lower. This promotes degassing of the molded body before the appearance of a liquid phase and right after the appearance of a liquid phase and also improves the sinterability in the sintering step of step (7-2).

In step (7-2), the molded body is held at a temperature of from 1,400° C. or higher to 1,500° C. or lower under a vacuum condition of 70 Pa or lower. This causes the aggregation of the composite compound phase in the vicinity of the pores in the molded body, whereby an aggregate can be formed, and the pores can be eliminated or reduced in size accordingly.

In step (7-3), the molded body is cooled from a temperature of from 1,400° C. or higher to 1,500° C. or lower to room temperature under a vacuum condition of 70 Pa or lower, so that a cemented carbide is obtained. This can prevent the cemented carbide from being oxidized.

Grinding and edge honing may be performed, as necessary, on the cemented carbide obtained through the above steps. The cemented carbide according to the present invention refers to a concept encompassing cemented carbides which have undergone the machining described above.

A method of manufacturing a coated cemented carbide according to the present embodiment will now be described using specific examples. It should be noted that the method of manufacturing a coated cemented carbide according to the present embodiment is not particularly limited, as long as the configurations of the coated cemented carbide may be achieved.

A lower layer including one or more Ti compound layers may, for example, be formed by the method set forth below.

For instance, a Ti compound layer, being comprised of a Ti nitride layer (hereinafter also referred to as a "TiN layer"), can be formed by chemical vapor deposition with a raw material composition of $TiCl_4$: from 5.0 mol % or more to 10.0 mol % or less, $N_2$: from 20 mol % or more to 60 mol % or less, and $H_2$: the balance, a temperature of from 850° C. or higher to 950° C. or lower, and a pressure of from 300 hPa or higher to 400 hPa or lower.

A Ti compound layer, being comprised of a Ti carbide layer (hereinafter also referred to as a "TiC layer"), can be formed by chemical vapor deposition with a raw material composition of $TiCl_4$: from 1.5 mol % or more to 3.5 mol % or less, $CH_4$: from 3.5 mol % or more to 5.5 mol % or less, and $H_2$: the balance, a temperature of from 950° C. or higher to 1,050° C. or lower, and a pressure of from 70 hPa or higher to 80 hPa or lower.

A Ti compound layer, being comprised of a Ti carbonitride layer (hereinafter also referred to as a "TiCN layer"), can be formed by chemical vapor deposition with a raw material composition of $TiCl_4$: from 5.0 mol % or more to 7.0 mol % or less, $CH_3CN$: from 0.5 mol % or more to 1.5 mol % or less, and $H_2$: the balance, a temperature of from 800° C. or higher to 900° C. or lower, and a pressure of from 60 hPa or higher to 80 hPa or lower.

A Ti compound layer, being comprised of a Ti carboxynitride layer (hereinafter also referred to as a "TiCNO layer"), can be formed by chemical vapor deposition with a raw material composition of $TiCl_4$: from 3.0 mol % or more to 4.0 mol % or less, CO: from 0.5 mol % or more to 1.0 mol % or less, $N_2$: from 30 mol % or more to 40 mol % or less, and $H_2$: the balance, a temperature of from 950° C. or higher to 1,050° C. or lower, and a pressure of from 50 hPa or higher to 150 hPa or lower.

A Ti compound layer, being comprised of a Ti carboxide layer (hereinafter also referred to as a "TiCO layer"), can be formed by chemical vapor deposition with a raw material composition of $TiCl_4$: from 1.0 mol % or more to 2.0 mol % or less, CO: from 2.0 mol % or more to 3.0 mol % or less, and $H_2$: the balance, a temperature of from 950° C. or higher to 1,050° C. or lower, and a pressure of from 50 hPa or higher to 150 hPa or lower.

An intermediate layer, being comprised of an α-type aluminum oxide layer (hereinafter also referred to as an "$Al_2O_3$ layer"), is formed by, for example, the method set forth below.

Firstly, a lower layer, being comprised of one or more Ti compound layers, is formed on a surface of a substrate. Next, from among such layers, a surface of a layer which is most distant from the substrate is oxidized. Thereafter, a nucleus of an α-type aluminum oxide layer is formed on the surface of the layer which is most distant from the substrate, and an α-type aluminum oxide layer is then formed in the state in which such nucleus has been formed.

More specifically, the oxidation of the surface of the layer which is most distant from the substrate is performed under the conditions of a gas composition of CO: from 0.1 mol % or more to 0.3 mol % or less, $CO_2$: from 0.3 mol % or more to 1.0 mol % or less, and $H_2$: the balance, a temperature of from 950° C. or higher to 1,050° C. or lower, and a pressure of from 50 hPa or higher to 60 hPa or lower (an oxidation step). Here, the oxidation process time is preferably from 1 minutes or more to 3 minutes or less.

Thereafter, the nucleus of the α-type aluminum oxide layer is formed by chemical vapor deposition with a raw material gas composition of $AlCl_3$: from 1.0 mol % or more to 4.0 mol % or less, CO: from 0.05 mol % or more to 2.0 mol % or less, $CO_2$: from 1.0 mol % or more to 3.0 mol % or less, HCl: from 2.0 mol % or more to 3.0 mol % or less, and $H_2$: the balance, a temperature of from 880° C. or higher to 930° C. or lower, and a pressure of from 60 hPa or higher to 80 hPa or lower (a nucleus formation step).

The α-type aluminum oxide layer is then formed by chemical vapor deposition with a raw material gas composition of $AlCl_3$: from 2.0 mol % or more to 5.0 mol % or less, $CO_2$: from 2.5 mol % or more to 4.0 mol % or less, HCl: from 2.0 mol % or more to 3.0 mol % or less, $H_2S$: from 0.15 mol % or more to 0.25 mol % or less, and $H_2$: the balance, a temperature of from 950° C. or higher to 1,000° C. or lower, and a pressure of from 60 hPa or higher to 80 hPa or lower (a deposition step).

Further, an upper layer, including a Ti compound layer (hereinafter also referred to as a "Ti compound layer") containing a Ti carbide, a Ti nitride or a Ti carbonitride, is formed on a surface of the α-type aluminum oxide layer.

For instance, a Ti compound layer, being comprised of a Ti nitride layer (hereinafter also referred to as a "TiN layer"), can be formed by chemical vapor deposition with a raw material composition of $TiCl_4$: from 5.0 mol % or more to 10.0 mol % or less, $N_2$: from 20 mol % or more to 60 mol % or less, and $H_2$: the balance, a temperature of from 950° C. or higher to 1,000° C. or lower, and a pressure of from 300 hPa or higher to 400 hPa or lower.

A Ti compound layer, being comprised of a Ti carbide layer (hereinafter also referred to as a "TiC layer"), can be formed by chemical vapor deposition with a raw material composition of $TiCl_4$: from 1.5 mol % or more to 3.5 mol % or less, $CH_4$: from 3.5 mol % or more to 5.5 mol % or less, and $H_2$: the balance, a temperature of from 950° C. or higher to 1,050° C. or lower, and a pressure of from 70 hPa or higher to 80 hPa or lower.

A Ti compound layer, being comprised of a Ti carbonitride layer (hereinafter also referred to as a "TiCN layer"), can be formed by chemical vapor deposition with a raw material composition of $TiCl_4$: from 5.0 mol % or more to 7.0 mol % or less, $CH_3CN$: from 0.5 mol % or more to 1.5 mol % or less, and $H_2$: the balance, a temperature of from 800° C. or higher to 900° C. or lower, and a pressure of from 60 hPa or higher to 80 hPa or lower.

EXAMPLES

Although the present invention will be described in further detail below, with examples, the present invention is not limited to such examples.

Example 1

[Manufacture of Cemented Carbide]

As raw material powders, a tungsten carbide powder with an average particle size of from 1.5 μm or more to 3.0 μm or less (see FIG. 5), a TiN powder with an average particle size of 3.0 μm, a TiC powder with an average particle size of 3.0 μm, a TiCN powder with an average particle size of 3.0 μm, an NbC powder with an average particle size of 3.0 μm, a ZrCN powder with an average particle size of 3.0 μm, a $Cr_3C_2$ powder with an average particle size of 3.0 μm, a VC powder with an average particle size of 3.0 μm, a TaC powder with an average particle size of 3.0 μm and a Co powder with an average particle size of 1.5 μm were prepared. Commercially available powders were used for such raw material powders. The average particle sizes of the raw material powders were measured by the Fisher method (Fisher Sub-Sieve Sizer (FSSS)) indicated in standard B330 of the American Society for Testing and Materials (ASTM). The average particle size of paraffin was measured using a particle size distribution measuring device.

(Production of Normal Granules)

As to invention samples 1 to 12, comparative samples 1 to 3 and comparative samples 5 to 8, the prepared raw material powders were weighed so as to achieve the formulation composition shown in Table 1 below, and the weighed raw material powders were received in a stainless steel pot, together with a hexane solvent, paraffin with an average particle size of 30 μm and a cemented carbide ball, where mixing and crushing were performed with a wet ball mill for 24 hours. After the mixing and crushing with the wet ball mill, the resulting mixture was subjected to spray drying at a drying temperature of from 100° C. or higher to 200° C. or lower in a nitrogen stream, so that the hexane solvent was evaporated, whereby solid granules having no pores therein (normal granules) were obtained.

(Production of Small-diameter Granules)

As to invention samples 1 to 12, comparative sample 1, comparative samples 3 to 5 and comparative sample 7, the prepared raw material powders were weighed so as to achieve the formulation composition shown in Table 1 below, and the weighed raw material powders were received in a stainless steel pot, together with an alcohol solvent, paraffin with an average particle size of approximately 15 μm and a cemented carbide ball, where mixing and crushing were performed with a wet ball mill for 24 hours. After the mixing and crushing with the wet ball mill, the resulting mixture was subjected to spray drying at a drying temperature of from 100° C. or higher to 200° C. or lower in a nitrogen stream, so that the alcohol solvent was evaporated, whereby hollow granules having small-diameter pores (small-diameter granules) were obtained.

(Production of Large-diameter Granules)

As to invention samples 1 to 11, comparative sample 1 and comparative samples 4 to 6, the prepared raw material powders were weighed so as to achieve the formulation composition shown in Table 1 below, and the weighed raw material powders were received in a stainless steel pot, together with an alcohol solvent, paraffin with an average particle size of approximately 50 μm and a cemented carbide ball, where mixing and crushing were performed with a wet ball mill for 24 hours. After the mixing and crushing with the wet ball mill, the resulting mixture was subjected to spray drying at a drying temperature of from 100° C. or higher to 200° C. or lower in a nitrogen stream, so that the alcohol solvent was evaporated, whereby hollow granules having large-diameter pores (large-diameter granules) were obtained.

Next, the respective granules produced were blended at the mass ratios shown in Table 2, and the blended granules were placed into a mixing container and then mixed for 5 minutes or more to 10 minutes or less, whereby a mixture was obtained. The obtained mixture was press molded under the condition of a load of from 2 t or more to 3 t or less, using a mold which allowed the post-sintering shape to match an ISO standard insert shape CNMG120412, whereby a molded body of the mixture was then obtained.

TABLE 1

| Sample No. | WC average particle size (μm) | Formulation composition (volume %) |
|---|---|---|
| Invention sample 1 | 2.0 | 70.1% WC, 5.2% TiN, 1.5% TiC, 4.8% NbC, 0.6% ZrCN, 0.8% $Cr_3C_2$, 17% Co |
| Invention sample 2 | 2.0 | 85.0% WC, 3.2% TiN, 0.9% TiC, 3.0% NbC, 0.4% ZrCN, 0.5% $Cr_3C_2$, 7% Co |
| Invention sample 3 | 2.0 | 80.0% WC, 2.0% TiN, 0.6% TiC, 1.9% NbC, 0.2% ZrCN, 0.3% $Cr_3C_2$, 15% Co |
| Invention sample 4 | 2.0 | 80.0% WC, 4.0% TiN, 1.2% TiC, 3.7% NbC, 0.5% ZrCN, 0.6% $Cr_3C_2$, 10% Co |
| Invention sample 5 | 2.0 | 80.0% WC, 4.0% TiN, 1.2% TiC, 3.7% NbC, 0.5% ZrCN, 0.6% $Cr_3C_2$, 10.0% Co |
| Invention sample 6 | 2.0 | 80.0% WC, 4.0% TiN, 1.2% TiC, 3.7% NbC, 0.5% ZrCN, 0.6% $Cr_3C_2$, 10.0% Co |
| Invention sample 7 | 2.0 | 80.0% WC, 4.0% TiN, 1.2% TiC, 3.7% NbC, 0.5% ZrCN, 0.6% $Cr_3C_2$, 10.0% Co |
| Invention sample 8 | 2.0 | 80.0% WC, 4.0% TiN, 1.2% TiC, 3.7% NbC, 0.5% ZrCN, 0.6% $Cr_3C_2$, 10.0% Co |
| Invention sample 9 | 1.5 | 80.0% WC, 4.0% TiN, 1.2% TiC, 4.2% TiCN, 0.2% VC, 0.4% $Cr_3C_2$, 10.0% Co |
| Invention sample 10 | 3.0 | 80.0% WC, 4.0% TiN, 1.2% TiC, 4.2% TaC, 0.6% $Cr_3C_2$, 10.0% Co |
| Invention sample 11 | 2.0 | 75.0% WC, 5.5% TiN, 1.8% TiC, 4.9% NbC, 0.8% $Cr_3C_2$, 12.0% Co |
| Invention sample 12 | 2.5 | 75.0% WC, 5.5% TiN, 1.8% TiC, 4.9% NbC, 0.8% $Cr_3C_2$, 12.0% Co |
| Comparative sample 1 | 2.0 | 90.0% WC, 2.0% TiN, 0.6% TiC, 1.9% NbC, 0.2% ZrCN, 0.3% $Cr_3C_2$, 5.0% Co |
| Comparative sample 2 | 2.0 | 80.0% WC, 4.0% TiN, 1.2% TiC, 3.7% NbC, 0.5% ZrCN, 0.6% $Cr_3C_2$, 10.0% Co |
| Comparative sample 3 | 2.0 | 65.0% WC, 4.0% TiN, 1.2% TiC, 3.7% NbC, 0.5% ZrCN, 0.6% $Cr_3C_2$, 25.0% Co |
| Comparative sample 4 | 2.0 | 80.0% WC, 4.0% TiN, 1.2% TiC, 3.7% NbC, 0.5% ZrCN, 0.6% $Cr_3C_2$, 10.0% Co |
| Comparative sample 5 | 2.0 | 80.0% WC, 4.0% TiN, 1.2% TiC, 3.7% NbC, 0.5% ZrCN, 0.6% $Cr_3C_2$, 10.0% Co |
| Comparative sample 6 | 3.0 | 80.0% WC, 5.5% TiN, 1.8% TiC, 4.0% NbC, 0.9% ZrCN, 0.8% $Cr_3C_2$, 7.0% Co |
| Comparative sample 7 | 3.0 | 80.0% WC, 5.5% TiN, 1.8% TiC, 4.0% NbC, 0.9% ZrCN, 0.8% $Cr_3C_2$, 7.0% Co |
| Comparative sample 8 | 1.5 | 85.0% WC, 15.0% Co |

TABLE 2

| Sample No. | Normal granule (mass %) | Small-diameter granule (mass %) | Large-diameter granule (mass %) |
|---|---|---|---|
| Invention sample 1 | 50 | 25 | 25 |
| Invention sample 2 | 50 | 25 | 25 |
| Invention sample 3 | 50 | 25 | 25 |
| Invention sample 4 | 50 | 25 | 25 |
| Invention sample 5 | 26 | 49 | 25 |
| Invention sample 6 | 69 | 6 | 25 |
| Invention sample 7 | 66 | 25 | 9 |
| Invention sample 8 | 25 | 25 | 50 |

TABLE 2-continued

| Sample No. | Normal granule (mass %) | Small-diameter granule (mass %) | Large-diameter granule (mass %) |
|---|---|---|---|
| Invention sample 9 | 50 | 25 | 25 |
| Invention sample 10 | 50 | 25 | 25 |
| Invention sample 11 | 5 | 25 | 70 |
| Invention sample 12 | 60 | 40 | 0 |
| Comparative sample 1 | 50 | 25 | 25 |
| Comparative sample 2 | 100 | 0 | 0 |
| Comparative sample 3 | 75 | 25 | 0 |
| Comparative sample 4 | 0 | 75 | 25 |
| Comparative sample 5 | 7 | 6 | 87 |
| Comparative sample 6 | 50 | 0 | 50 |
| Comparative sample 7 | 50 | 50 | 0 |
| Comparative sample 8 | 100 | 0 | 0 |

After the molded body of the mixture was received in a sintering furnace, the temperature was raised from room temperature to a target raised temperature of from 1,400° C. or higher to 1,500° C. or lower in a vacuum with a pressure of 70 Pa or lower. The molded body was held for 60 minutes at the relevant temperature, whereby the sintering of the molded body was performed. After the sintering, the molded body was cooled at a cooling rate of 5° C./min or higher to 30° C./min or lower in a vacuum with a pressure of 70 Pa or lower.

A cemented carbide was produced by sintering the molded body of the mixture, as described above. Further, the cutting edge of the obtained cemented carbide was subjected to honing by means of an SiC brush.

[Formation of Coating Layer]

After the surface of the cemented carbide which had undergone honing was washed, a coating layer was formed by chemical vapor deposition. Firstly, the cemented carbide was inserted into an external heating chemical vapor deposition apparatus, and a first layer of the lower layer, whose composition is shown in Table 4, was formed on the substrate surface so as to have the average thickness shown in Table 4 under the raw material composition, temperature and pressure conditions shown in Table 3. Then, a second layer of the lower layer, whose composition is shown in Table 4, was formed on the surface of the first layer so as to have the average thickness shown in Table 4 under the raw material composition, temperature and pressure conditions shown in Table 3. Next, a third layer of the lower layer, whose composition is shown in Table 4, was formed on the surface of the second layer so as to have the average thickness shown in Table 4 under the raw material composition, temperature and pressure conditions shown in Table 3. Thereafter, the surface of the third layer was oxidized for 2 minutes, under the composition, temperature and pressure conditions shown in Table 3. Then, a nucleus of α-type aluminum oxide was formed on the oxidized surface of the third layer under the raw material composition, temperature and pressure conditions shown in Table 3. Further, an intermediate layer (α-type aluminum oxide layer), whose composition is shown in Table 4, was formed on the surface of the third layer and the surface of the nucleus of α-type aluminum oxide so as to have the average thickness shown in Table 4 under the raw material composition, temperature and pressure conditions shown in Table 3. Lastly, an upper layer (TiN layer), whose composition is shown in Table 4, was formed on the surface of the α-type aluminum oxide layer so as to have the average thickness shown in Table 4 under the raw material composition, temperature and pressure conditions shown in Table 3. As a result, the coated cemented carbides of invention samples 1 to 12 and comparative samples 1 to 8 were obtained.

The thickness of each layer of the coating layer of each of the samples was obtained as set forth below. That is, using an FE-SEM, the average thickness was obtained by: measuring the thickness of each layer, from each of the cross-sectional surfaces at three locations near the position 50 μm from the edge of the coated cutting tool, toward the center of the rake surface thereof; and calculating the arithmetic mean of the resulting measurements. Using an EDS, the composition of each layer of the obtained sample was measured from the cross-sectional surface near the position at most 50 μm from the edge of the coated cutting tool, toward the center of the rake surface thereof.

TABLE 3

| Each layer composition | Temperature (° C.) | Pressure (hPa) | Raw material composition (mol %) |
|---|---|---|---|
| TiN (First layer) | 900 | 350 | $TiCl_4$:7.5%, $N_2$:40.0%; $H_2$:52.5% |
| TiCN (Second layer) | 850 | 70 | $TiCl_4$:6.0%, $CH_3CN$:1.0%; $H_2$:93.0% |
| TiCNO (Third layer) | 1,000 | 100 | $TiCl_4$:3.5%, CO:0.7%; $N_2$:35.5%, $H_2$:60.3% |
| $Al_2O_3$ layer | | | Oxidation process |
| | 1,000 | 55 | CO:0.3%; $CO_2$:0.5%, $H_2$:99.2% Nucleus formation step |
| | 900 | 70 | $AlCl_3$:2.0%, CO:1.0%; $CO_2$:1.5%, HCl:2.5%, $H_2$:93.0% Deposition step |
| TiN (Upper layer) | 990 | 70 | $AlCl_3$:3.0%, $CO_2$:3.0%, HCl:2.5%, $H_2S$:0.20%, $H_2$:91.3% |
| | 1,000 | 350 | $TiCl_4$:7.5%, $N_2$:40.0%; $H_2$:52.5% |

TABLE 4

| First layer | | Second layer | | Third layer | | Al$_2$O$_3$ layer | | Upper layer | | Thickness of entire coating layer (μm) |
| --- | --- | --- | --- | --- | --- | --- | --- | --- | --- | --- |
| Composition | Average thickness (μm) | Composition | Average thickness (μm) | Composition | Average thickness (μm) | Composition | Average thickness (μm) | Composition | Average thickness (μm) | |
| TiN | 0.2 | TiCN | 6.0 | TiCNO | 0.3 | Al$_2$O$_3$ | 9.0 | TiN | 0.3 | 15.8 |

Each of the obtained samples (coated cemented carbides) was mirror-polished in a direction orthogonal to a surface thereof. An observation of the mirror-polished surface was conducted, with an SEM provided with an EDS, on cross-sectional (mirror-polished surface) structures at three locations within 500 μm in the depth direction below the surface of the cemented carbide (the interface between the coating layer and the cemented carbide in the coating cemented carbide). As to each of such cross-sectional structures at three locations, the composition of each of the hard phase, the composite compound phase and the binder phase in the cemented carbide was measured using the EDS. The results were then used to obtain the content ratios (unit:volume %) of the hard phase, the composite compound phase and the binder phase in the cemented carbide. It should be noted that, as to the content ratio of each phase, the arithmetic mean of the ratios from the cross-sectional structures at three locations was obtained. Further, photographs were taken of the above cross-sectional structures. A large number of lines were drawn at random on each of the obtained photographs of the cross-sectional structures, and then the particle sizes of all the tungsten particles traversed by such lines were obtained with the Fullman formula (J. Metals, March 1953, 447). The resulting values were used to obtain an average particle size of the tungsten carbide. The results are shown in Table 5.

TABLE 5

| | Cemented carbide | | | | | |
| --- | --- | --- | --- | --- | --- | --- |
| | WC average particle size | Hard phase WC | Composite compound phase | | Binder phase | |
| Sample No. | (μm) | (volume %) | Composition | (Volume %) | Composition | (Volume %) |
| Invention sample 1 | 2.0 | 70 | TiN, TiC, NbC, ZrCN, Cr$_3$C$_2$ | 13 | Co | 17 |
| Invention sample 2 | 2.0 | 85 | TiN, TiC, NbC, ZrCN, Cr$_3$C$_2$ | 8 | Co | 8 |
| Invention sample 3 | 2.0 | 80 | TiN, TiC, NbC, ZrCN, Cr$_3$C$_2$ | 5 | Co | 15 |
| Invention sample 4 | 2.0 | 80 | TiN, TiC, NbC, ZrCN, Cr$_3$C$_2$ | 10 | Co | 10 |
| Invention sample 5 | 2.0 | 80 | TiN, TiC, NbC, ZrCN, Cr$_3$C$_2$ | 10 | Co | 10 |
| Invention sample 6 | 2.0 | 80 | TiN, TiC, NbC, ZrCN, Cr$_3$C$_2$ | 10 | Co | 10 |
| Invention sample 7 | 2.0 | 80 | TiN, TiC, NbC, ZrCN, Cr$_3$C$_2$ | 10 | Co | 10 |
| Invention sample 8 | 2.0 | 80 | TiN, TiC, NbC, ZrCN, Cr$_3$C$_2$ | 10 | Co | 10 |
| Invention sample 9 | 1.5 | 80 | TiN, TiC, TiCN, VC, Cr$_3$C$_2$ | 10 | Co | 10 |
| Invention sample 10 | 3.0 | 80 | TiN, TiC, TaC, Cr$_3$C$_2$ | 10 | Co | 10 |
| Invention sample 11 | 2.0 | 75 | TiN, TiC, NbC, Cr$_3$C$_2$ | 13 | Co | 12 |
| Invention sample 12 | 2.5 | 75 | TiN, TiC, NbC, Cr$_3$C$_2$ | 13 | Co | 12 |
| Comparative sample 1 | 2.0 | 90 | TiN, TiC, NbC, ZrCN, Cr$_3$C$_2$ | 5 | Co | 5 |
| Comparative sample 2 | 2.0 | 80 | TiN, TiC, NbC, ZrCN, Cr$_3$C$_2$ | 10 | Co | 10 |
| Comparative sample 3 | 2.0 | 65 | TiN, TiC, NbC, ZrCN, Cr$_3$C$_2$ | 10 | Co | 25 |
| Comparative sample 4 | 2.0 | 80 | TiN, TiC, NbC, ZrCN, Cr$_3$C$_2$ | 10 | Co | 10 |
| Comparative sample 5 | 2.0 | 80 | TiN, TiC, NbC, ZrCN, Cr$_3$C$_2$ | 10 | Co | 10 |
| Comparative sample 6 | 3.0 | 80 | TiN, TiC, NbC, ZrCN, Cr$_3$C$_2$ | 13 | Co | 7 |
| Comparative sample 7 | 3.0 | 80 | TiN, TiC, NbC, ZrCN, Cr$_3$C$_2$ | 13 | Co | 7 |
| Comparative sample 8 | 1.5 | 85 | — | 0 | Co | 15 |

* The "—" symbol for comparative sample 8 in Table 5 indicates that a composite compound phase is not formed.

Each of the obtained samples (coated cemented carbides) was mirror-polished in a direction orthogonal to a surface thereof. An observation of the mirror-polished surface was conducted, with the SEM, on a cross-sectional (mirror-polished surface) structure located at a position of 50 μm in the depth direction below the surface of the cemented carbide (the interface between the coating layer and the cemented carbide in the coating cemented carbide) and a cross-sectional (mirror-polished surface) structure located within not less than 500 μm in the depth direction therebelow, through magnification of 1,000 times. Then, using the method explained in the section concerning the definition of "aggregate," the existence or absence of an aggregate of the obtained sample (coated cemented carbide) was checked. Further, photographs were taken of the above respective cross-sectional structures, and $S_{SDA}$, $I_{SDA}$, $S_{LDA}$ and $I_{LDA}$ were obtained from the resulting photographs of the cross-sectional structures, using commercially available image analysis software. The results are shown in Table 6.

TABLE 6

| | | Aggregate | | | |
|---|---|---|---|---|---|
| | | Small-diameter aggregate | | Large-diameter aggregate | |
| Sample No. | Existing/ Absent | $S_{SDA}$ (area %) | $I_{SDA}$ (area %) | $S_{LDA}$ (area %) | $I_{LDA}$ (area %) |
| Invention sample 1 | Existing | 2.0 | 0.7 | 0.5 | 3.0 |
| Invention sample 2 | Existing | 2.0 | 0.7 | 0.5 | 3.0 |
| Invention sample 3 | Existing | 2.0 | 0.7 | 0.5 | 3.0 |
| Invention sample 4 | Existing | 2.0 | 0.7 | 0.5 | 3.0 |
| Invention sample 5 | Existing | 3.9 | 1.4 | 0.5 | 3.0 |
| Invention sample 6 | Existing | 0.5 | 0.2 | 0.5 | 3.0 |
| Invention sample 7 | Existing | 2.0 | 1.0 | 0.2 | 1.1 |
| Invention sample 8 | Existing | 2.0 | 1.0 | 1.0 | 6.0 |
| Invention sample 9 | Existing | 2.0 | 0.7 | 0.5 | 3.0 |
| Invention sample 10 | Existing | 2.0 | 0.7 | 0.5 | 3.0 |
| Invention sample 11 | Existing | 2.0 | 2.5 | 1.4 | 3.0 |
| Invention sample 12 | Existing | 3.2 | 1.6 | 0.0 | 4.6 |
| Comparative sample 1 | Existing | 2.0 | 0.7 | 0.5 | 3.0 |
| Comparative sample 2 | Absent | 0.0 | 0.0 | 0.0 | 0.0 |
| Comparative sample 3 | Existing | 2.0 | 0.7 | 0.0 | 3.0 |
| Comparative sample 4 | Existing | 8.5 | 2.1 | 0.5 | 3.0 |
| Comparative sample 5 | Existing | 0.5 | 0.2 | 1.7 | 10.4 |
| Comparative sample 6 | Existing | 0.0 | 0.0 | 1.0 | 5.2 |
| Comparative sample 7 | Existing | 2.0 | 0.7 | 0.0 | 0.0 |
| Comparative sample 8 | Absent | 0.0 | 0.0 | 0.0 | 0.0 |

Cutting tests were conducted using the obtained samples. Cutting test 1 below is a wear resistance test for evaluating wear derived from plastic deformation, and cutting test 2 below is a fracture resistance test for evaluating fracture derived from toughness. The conditions for the cutting tests are as set forth below, and the results of such cutting tests are shown in Table 7.

[Cutting test 1]
Tool shape: CNMG120412
Workpiece: Carbon steel (S45C)
Workpiece shape: Round bar
Cutting speed: 230 m/min
Feed: 0.25 mm/rev
Depth of cut: 2.0 mm
Coolant: Used
Evaluation items: A time when a sample was fractured or had a maximum flank wear width of 0.2 mm was defined as the end of the tool life, and the machining time to reach the end of the tool life was measured. Further, the damage state for a processing time of 10 minutes was checked with an SEM.

[Cutting test 2]
Tool shape: CNMG120412
Workpiece: Two pieces of carbon steel (S45C)
Workpiece shape: Grooved round bar
Cutting speed: 150 m/min
Feed: 0.15 mm/rev
Depth of cut: 1.7 mm
Coolant: Used
Evaluation items: A time when a sample was fractured or had a maximum flank wear width of 0.2 mm was defined as the end of the tool life, and the number of shocks the sample had received until the end of the tool life was measured. The damage state when the number of shocks reached 5,000 was checked with an SEM. The number of shocks was set at 15,000 at a maximum.

As to the machining time to reach the end of the tool life in cutting test 1 (wear test), evaluations were made with grade "A" for 30 minutes or more, grade "B" for 25 minutes or more and less than 30 minutes, and grade "C" for less than 25 minutes. Further, as to the number of shocks until the end of the tool life in cutting test 2 (fracture test), evaluations were made with grade "A" for 13,000 or more, grade "B" for 11,000 or more and less than 13,000, and grade "C" for less than 11,000. In such evaluations, "A" refers to excellent, "B" refers to good and "C" refers to inferior. The grade on the machining time in cutting test 1 being "A" or "B" and the grade on the number of shocks in cutting test 2 being "A" or "B" mean that the sample has excellent cutting performance. The evaluation results are shown in Table 7.

TABLE 7

| | Cutting test (1) | | | Cutting test (2) | |
|---|---|---|---|---|---|
| Sample No. | Damage state | Machining time | Grade | Number of shocks (shocks) | Grade |
| Invention sample 1 | Normal wear | 26 | B | 15,000 | A |
| Invention sample 2 | Normal wear | 36 | A | 12,100 | B |
| Invention sample 3 | Normal wear | 27 | B | 13,100 | A |
| Invention sample 4 | Normal wear | 35 | A | 15,000 | A |
| Invention sample 5 | Normal wear | 38 | A | 14,600 | A |
| Invention sample 6 | Normal wear | 29 | B | 14,200 | A |
| Invention sample 7 | Normal wear | 31 | A | 14,300 | A |

TABLE 7-continued

| Sample No. | Cutting test (1) | | | Cutting test (2) | |
|---|---|---|---|---|---|
| | Damage state | Machining time | Grade | Number of shocks (shocks) | Grade |
| Invention sample 8 | Normal wear | 37 | A | 13,800 | A |
| Invention sample 9 | Normal wear | 34 | A | 12,500 | B |
| Invention sample 10 | Normal wear | 28 | B | 15,000 | A |
| Invention sample 11 | Normal wear | 37 | A | 12,300 | B |
| Invention sample 12 | Normal wear | 35 | A | 14,800 | A |
| Comparative sample 1 | Chipping | 15 | C | 7,600 | C |
| Comparative sample 2 | Plastic deformation | 20 | C | 15,000 | A |
| Comparative sample 3 | Plastic deformation | 14 | C | 15,000 | A |
| Comparative sample 4 | Chipping | 17 | C | 6,400 | C |
| Comparative sample 5 | Normal wear | 28 | B | 10,500 | C |
| Comparative sample 6 | Plastic deformation | 22 | C | 14,000 | A |
| Comparative sample 7 | Plastic deformation | 23 | C | 14,200 | A |
| Comparative sample 8 | Plastic deformation | 12 | C | 8,800 | C |

The results in Table 7 show that each invention sample had grade "A" or "B" in terms of both the machining time and the number of shocks, indicating that such invention sample had excellent wear resistance and fracture resistance.

INDUSTRIAL APPLICABILITY

Each of the cemented carbide and the coated cemented carbide according to the present invention has excellent wear resistance and fracture resistance. Accordingly, particularly in the machining of difficult-to-machine materials, each of such cemented carbide and such coated cemented carbide can be suitably used for a cutting tool and is therefore, in such respect, worth being used from an industrial viewpoint.

What is claimed is:

1. A cemented carbide comprising: a hard phase containing tungsten carbide as its main component; a binder phase containing an element of at least one kind selected from the group consisting of Co, Ni and Fe as its main component; and a composite compound phase, wherein:
based on total contents of the hard phase, the binder phase and the composite compound phase in the cemented carbide, a content ratio of the hard phase is from 70 volume % or more to 85 volume % or less, a content ratio of the binder phase is from 7.0 volume % or more to 17.0 volume % or less, and a content ratio of the composite compound phase is from 5.0 volume % or more to 15.0 volume % or less;
the composite compound phase comprises an aggregate;
the aggregate comprises a small-diameter aggregate having a longest diameter of from 10 μm or more to below 30 μm and a large-diameter aggregate having a longest diameter of 30 μm or more;
the small-diameter aggregate containing at least one kind from among a carbide, a nitride and a carbonitride of an element of one kind selected from the group consisting of Ti, Zr, Hf, V, Nb, Ta, Cr and Mo as its main component;
the large-diameter aggregate containing at least one kind from among a carbide, a nitride and a carbonitride of an element of one kind selected from the group consisting of Ti, Zr, Hf, V, Nb, Ta, Cr and Mo as its main component;
a cross-sectional structure of a surface region which ranges inward from a surface of the cemented carbide to a depth of 100 μm satisfies a condition represented by formula (1A) below; and
a cross-sectional structure of an inner region further inward than the surface region satisfies a condition represented by formula (2A) below $$0.5 \leq S_{SDA} \leq 4.0 \tag{1A}$$

$$1.0 \leq I_{LDA} \leq 6.0 \tag{2A}$$

$S_{SDA}$ refers to a ratio (unit:area %) of a surface region cross-sectional area of the small-diameter aggregate based on a total cross-sectional area of the composite compound phase, $I_{LDA}$ refers to a ratio (unit:area %) of an inner region cross-sectional area of the large-diameter aggregate based on a total cross-sectional area of the composite compound phase.

2. The cemented carbide according to claim 1, wherein a cross-sectional structure of the surface region satisfies a condition represented by formula (2B) below $$S_{LDA} \leq 1.0 \tag{2B}$$

wherein $S_{LDA}$ refers to a ratio (unit:area %) of a surface region cross-sectional area of the large-diameter aggregate based on a total cross-sectional area of the composite compound phase.

3. The cemented carbide according to claim 1, wherein a cross-sectional structure of the inner region satisfies a condition represented by formula (1B) below $$0.5 \leq I_{SDA} \leq 2.0 \tag{1B}$$

wherein $I_{SDA}$ refers to a ratio (unit:area %) of an inner region cross-sectional area of the small-diameter aggregate based on a total cross-sectional area of the composite compound phase.

4. The cemented carbide according to claim 1, wherein an average particle size of the tungsten carbide is from 1.5 μm or more to 3.0 μm or less.

5. A coated cemented carbide comprising the cemented carbide according to claim 1 and a coating layer formed on a surface of the cemented carbide.

6. The coated cemented carbide according to claim 5, wherein an average thickness of the coating layer is from 3 μm or more to 20 μm or less.

7. The cemented carbide according to claim 2, wherein a cross-sectional structure of the inner region satisfies a condition represented by formula (1B) below $$0.5 \leq I_{SDA} \leq 2.0 \tag{1B}$$

wherein $I_{SDA}$ refers to a ratio (unit:area %) of an inner region cross-sectional area of the small-diameter aggregate based on a total cross-sectional area of the composite compound phase.

8. The cemented carbide according to claim 2, wherein an average particle size of the tungsten carbide is from 1.5 μm or more to 3.0 μm or less.

9. The cemented carbide according to claim 3, wherein an average particle size of the tungsten carbide is from 1.5 µm or more to 3.0 µm or less.

10. The cemented carbide according to claim 7, wherein an average particle size of the tungsten carbide is from 1.5 µm or more to 3.0 µm or less.

11. A coated cemented carbide comprising the cemented carbide according to claim 2 and a coating layer formed on a surface of the cemented carbide.

12. A coated cemented carbide comprising the cemented carbide according to claim 3 and a coating layer formed on a surface of the cemented carbide.

13. A coated cemented carbide comprising the cemented carbide according to claim 4 and a coating layer formed on a surface of the cemented carbide.

14. A coated cemented carbide comprising the cemented carbide according to claim 7 and a coating layer formed on a surface of the cemented carbide.

15. A coated cemented carbide comprising the cemented carbide according to claim 8 and a coating layer formed on a surface of the cemented carbide.

16. A coated cemented carbide comprising the cemented carbide according to claim 9 and a coating layer formed on a surface of the cemented carbide.

17. A coated cemented carbide comprising the cemented carbide according to claim 10 and a coating layer formed on a surface of the cemented carbide.

18. The coated cemented carbide according to claim 11, wherein an average thickness of the coating layer is from 3 µm or more to 20 µm or less.

19. The coated cemented carbide according to claim 12, wherein an average thickness of the coating layer is from 3 µm or more to 20 µm or less.

20. The coated cemented carbide according to claim 13, wherein an average thickness of the coating layer is from 3 µm or more to 20 µm or less.

* * * * *